(12) United States Patent
Burke et al.

(10) Patent No.: US 11,598,801 B2
(45) Date of Patent: Mar. 7, 2023

(54) METHOD FOR MANUFACTURING SYSTEM ANALYSIS AND/OR MAINTENANCE

(71) Applicant: Arch Systems Inc., Mountain View, CA (US)

(72) Inventors: Timothy Matthew Burke, Mountain View, CA (US); Andrew Galen Scheuermann, Mountain View, CA (US)

(73) Assignee: Arch Systems Inc., Mountain View, CA (US)

( * ) Notice: Subject to any disclaimer, the term of this patent is extended or adjusted under 35 U.S.C. 154(b) by 0 days.

(21) Appl. No.: 17/879,369

(22) Filed: Aug. 2, 2022

(65) Prior Publication Data

US 2023/0032751 A1    Feb. 2, 2023

Related U.S. Application Data

(60) Provisional application No. 63/228,495, filed on Aug. 2, 2021, provisional application No. 63/306,375, filed on Feb. 3, 2022.

(51) Int. Cl.
*G01R 31/28* (2006.01)

(52) U.S. Cl.
CPC ....... *G01R 31/281* (2013.01); *G01R 31/2808* (2013.01)

(58) Field of Classification Search
CPC .............. G01R 31/2808; G01R 31/281; G01R 31/2806; G01R 31/2812; G01R 31/309
See application file for complete search history.

(56) References Cited

U.S. PATENT DOCUMENTS

| | | | | |
|---|---|---|---|---|
| 5,245,421 A | * | 9/1993 | Robertson | H04N 7/18 348/E7.086 |
| 6,760,471 B1 | * | 7/2004 | Raymond | G06T 5/20 348/126 |
| 2006/0155425 A1 | * | 7/2006 | Howlett | G05D 1/0055 701/1 |
| 2007/0047797 A1 | * | 3/2007 | Vilella | G06T 7/0004 382/141 |
| 2014/0036459 A1 | | 2/2014 | Gutierrez et al. | |
| 2017/0215493 A1 | | 8/2017 | Maxey et al. | |
| 2018/0300865 A1 | | 10/2018 | Weiss et al. | |
| 2019/0019280 A1 | | 1/2019 | Rao et al. | |
| 2020/0126829 A1 | * | 4/2020 | Matsui | H01L 21/31 |

* cited by examiner

*Primary Examiner* — Thang X Le
(74) *Attorney, Agent, or Firm* — Jeffrey Schox; Samuel Rosenthal

(57) ABSTRACT

A method for factory analysis and/or maintenance, preferably including receiving factory information and/or associating defects with factory components, and optionally including acting based on defect associations and/or operating factory machines. The method is preferably associated with one or more manufacturing systems and/or elements thereof.

21 Claims, 9 Drawing Sheets defect: (TOMBSTONE, board 3, U1)

Board 3, U1 -> machine 2: feeder 1, nozzle holder 7, nozzle 12

Add 1/3 to linked defect sums for:
    feeder 1
    nozzle holder 7
    nozzle 12

| canonical | A | B | I |
|---|---|---|---|
| 1 | 1 | 1 | 1 |
| 2 | 4 | 2 | 6 |
| 3 | 2 | 4 | 2 |
| 4 | 5 | 3 | 5 |
| 5 | 3 | 5 | 3 |
| 6 | 6 | 6 | 4 |

METHOD FOR MANUFACTURING SYSTEM ANALYSIS AND/OR MAINTENANCE

CROSS-REFERENCE TO RELATED APPLICATIONS

This application claims the benefit of U.S. Provisional Application Ser. No. 63/228,495, filed on 2 Aug. 2021, and of U.S. Provisional Application Ser. No. 63/306,375, filed on 3 Feb. 2022, each of which is incorporated in its entirety by this reference.

TECHNICAL FIELD

This invention relates generally to the manufacturing field, and more specifically to a new and useful method for manufacturing system analysis and/or maintenance.

DESCRIPTION OF THE PREFERRED EMBODIMENTS

The following description of the preferred embodiments of the invention is not intended to limit the invention to these preferred embodiments, but rather to enable any person skilled in the art to make and use this invention.

1. Overview

Figure 1:
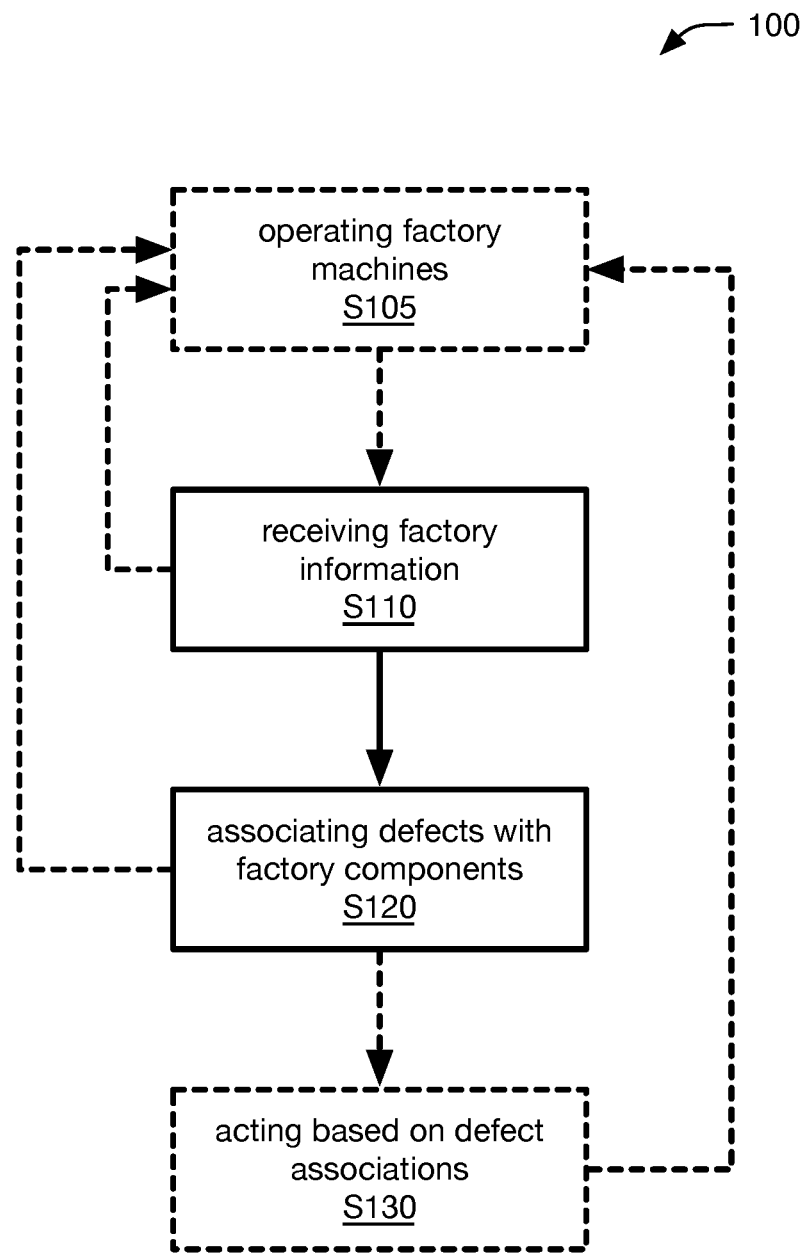
FIG. 1 is a schematic representation of an embodiment of the method.

A method 100 for factory analysis and/or maintenance preferably includes receiving factory information S110 and/or associating defects with factory components S120, and can optionally include acting based on defect associations S130 and/or operating factory machines S105 (e.g., as shown in FIG. 1). However, the method 100 can additionally or alternatively include any other suitable elements.

Figure 2A:
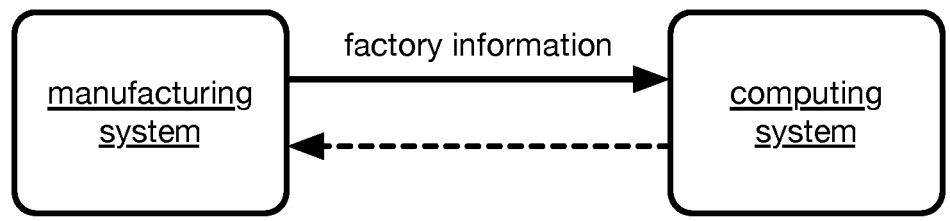
FIG. 2A is a schematic representation of an embodiment of a system for performing the method.

The method 100 is preferably associated with (e.g., directed toward maintenance, such as repair and/or predictive maintenance, for) one or more manufacturing systems (or elements thereof), such as described below in more detail. Further, the method can optionally be performed (in part or in whole) by and/or in association with one or more computing systems, manufacturing systems, and/or any other suitable systems (e.g., as shown in FIG. 2A).

2. Technical Advantages

Variants of the technology can confer one or more advantages over conventional technologies. In some examples, these advantages can facilitate analysis and/or maintenance of one or more manufacturing systems or elements thereof.

First, in some embodiments, the technology can enable determination and/or quantification (e.g., automated determination and/or quantification) of possible links between factory components (and/or other manufacturing elements) and defective products. For example, by attributing blame for detected product defects to the factory components that could be responsible for the defects (e.g., factory components that did or may have interacted with the defective regions or elements of the product), the factory components associated with large numbers of product defects may automatically accumulate large shares of such blame, which can enable and/or facilitate detection of these factory components as potential sources of manufacturing system errors.

Second, in some embodiments, the technology can enable determination (e.g., automated determination) of one or more data structures (e.g., matrices, such as stochastic matrices; graphs, such as directed and/or undirected graphs with edge weights; etc.) representative and/or indicative of links (e.g., importance metrics such as causal links, fractional blame links, etc.) between features of manufactured products (e.g., PCB assemblies) and the manufacturing elements (e.g., factory operations, programming parameters, machines and machine elements, etc.). These data structure(s) can provide one or more importance metrics associated with these links, which can enable sensitivity analyses associated with manufacturing elements represented therein. For example, this can enable analysis and/or quantification of manufacturing elements most likely to be associated with (e.g., the cause of) product defects, low production rates, and/or other undesired manufacturing system behavior.

Third, in some embodiments, the technology can enable and/or facilitate provision of manufacturing system information (e.g., associated with defects, defect blame, defect rates, causal links, etc.) to one or more users. For example, the technology can include one or more user interfaces that enable exploration of the links between factory components (and/or other manufacturing elements) and products, product components, and/or defects thereof.

Fourth, in some embodiments, the technology can enable and/or facilitate automated determination of maintenance recommendations and/or performance of manufacturing system maintenance tasks. For example, the technology can include determining (e.g., based on the links between manufacturing elements and products, product components, and/or defects thereof) one or more manufacturing elements that may be problematic (e.g., factory components that may require and/or benefit from inspection and/or maintenance, programming parameters that may require and/or benefit from alteration, etc.). Based on such determinations, the technology can optionally include presenting information indicative of these determinations, acting to effect changes based on these determinations (e.g., altering programming parameters, performing inspections and/or maintenance, etc.), and/or taking any other suitable actions.

Fifth, in some embodiments, the technology can enable determination and/or quantification (e.g., automated determination and/or quantification) of defect rates and/or other production rates. For example, information reported by (and/or in relation to) one or more manufacturing systems may not include successful production information (e.g., production of defect-free products), such as production counts, rates, and/or timing information (e.g., but rather may only include information indicative of detected defects and/or the associated timing and/or rates thereof); in this example, embodiments of the technology may act to determine such information associated with successful production. Accordingly, such information may be utilized to determine defect rates and/or other production rates.

Sixth, in some embodiments, the technology can enable standardization (e.g., automated standardization) of information received from (and/or in relation to) one or more manufacturing systems. In some examples, this information may include inconsistent program names (e.g., for assembly and/or inspection programs associated with manufacturing of a particular product), product location identifiers (e.g., array position indices), and/or other information. In some such embodiments, this standardization can enable and/or facilitate further analysis and/or presentation of the associated information (and/or derivatives thereof).

However, further advantages can additionally or alternatively be conferred by the system and/or method described herein.

3. Manufacturing System

Figure 2B:
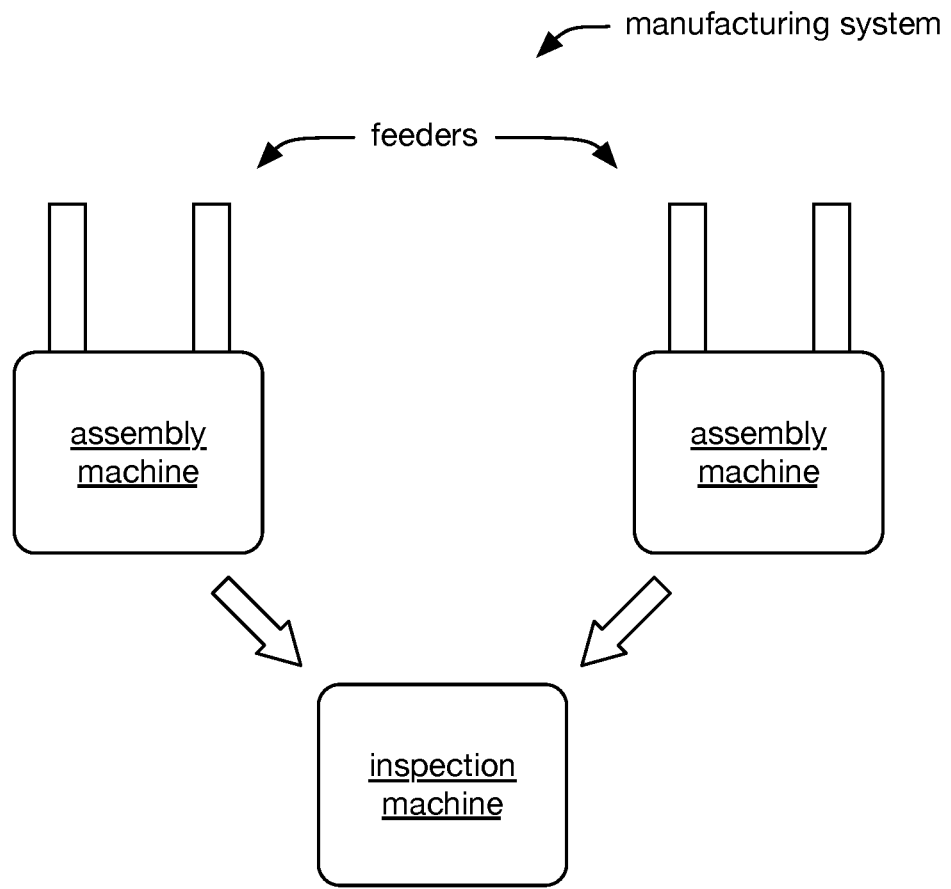
FIG. 2B is a schematic representation of an example of a manufacturing system.

As described above, the method can be associated with one or more manufacturing systems or elements thereof (e.g., as shown in FIG. 2B). For example, in some embodiments, the method can be associated with one or more factories, manufacturing lines, and/or other manufacturing systems (and/or elements thereof) for printed circuit board (PCB) assembly (e.g., one or more surface-mount technology (SMT) PCB manufacturing lines, including a plurality of assembly and inspection machines).

In some such embodiments, the factory can include one or more: PCB assembly machines, such as pick-and-place (PNP) machines, solder printers, ovens, and/or elements thereof; PCB inspection machines, such as optical and/or X-ray inspection tools (e.g., automated optical inspection (AOI) and/or automated X-ray inspection (AXI) machines), solder paste inspection (SPI) tools, in-circuit test (ICT) tools; and/or any other suitable entities. In examples, the PCB assembly machine elements can include one or more PNP elements, such as placement heads, nozzle holders on placement heads, nozzles attached to nozzle holders, cameras (e.g., cameras associated with nozzle holders, which can be used to detect part placement on nozzle holders; separate cameras such as "flying" cameras associated with placement heads, which can be used to detect panel placement, warpage, and/or other attributes; etc.), feeders, component reels, vacuum pumps and/or feeds, and the like; solder printer elements, such as stencils, squeegees, cameras (e.g., for inspecting board position and/or registering board position with stencil position), and the like; and/or any other suitable elements.

For example, an SMT line can include one or more modules (typically, a plurality of modules). Each module can be capable of holding a plurality of feeders (with the same or different components loaded into each feeder, or into subsets thereof). Each module preferably has a placement head with a plurality of nozzle holders, each of which can hold one of a plurality of different nozzles (e.g., wherein each nozzle has a particular size and shape). In a specific example, an SMT line (e.g., with Fuji NXT modules) includes 18 modules, each with 40 feeders, 24 nozzle holders, and more than 24 nozzles (e.g., 40–100 nozzles, about 60 nozzles, etc.).

Accordingly, for any particular component defect, there may be a large number (e.g., equal to the product of the number of modules, feeders per module, nozzle holders per module, and nozzles) of separate placement paths, each of which describes a path by which a component could come from a feeder, be picked up by a nozzle held in a nozzle holder, and then placed on a board, and any of these system components could potentially be associated with causing the defect; in addition, there may also be a variety of different sensors associated with the placement of the component, and thus also potentially associated with causing the defect. In typical manufacturing systems, defect information (e.g., determined using inspection equipment, such as described below in more detail) is not indicative of which of these placement paths (or subsets thereof, such as any system components in that placement path; e.g., which nozzle, nozzle holder, and/or feeder was used) was used to place the component, nor which of the system components (or system component types, such as nozzle versus feeder) may have been responsible for causing the defect.

Further, the operation of the factory is typically controlled by a large number of programming parameters. Among these programming parameters may be parameters that are specific to particular component types, assembly tools, placement paths, and/or other aspects. Accordingly, for any particular component defect, the defect may be attributable to one or more programming parameters, rather than (or in addition to) being attributable to one or more system components.

In examples, the programming parameters can include PNP parameters, printer parameters, oven parameters, and/or any other suitable parameters. The PNP parameters can include, in some examples: expected dimensions and/or shape of component, location to pick up component from, vacuum pressure to use to hold component, air pressure used to release component onto board, height to pick up, height over board at which to drop, movement profile to use, waiting periods (e.g., wait for N milliseconds before picking up from reel, such as to compensate for slow feeder movement; wait for M milliseconds before dropping part on board, such as to halt lateral motion; etc.), force to use to push chip down into solder paste, and the like. The printer parameters can include, in some examples: force to apply to squeegee to squeeze paste through stencil, cleaning cycle interval (e.g., clean every 5 panels, every 10, etc.), motion profile and/or speed to use to lower stencil onto panel, motion profile and/or speed to use to release stencil from board after paste deposited, speed at which squeegee moves, speed at which squeegee retracts to starting point, amount of solder paste to coat onto stencil, and so on. Over parameters can include, in some examples: temperature profile of oven, speed of board through oven, dwell time at each temperature, and so on. However, the programming parameters can additionally or alternatively include any other suitable parameters.

In typical PCB factory (e.g., SMT factory) operation, production defects can be detected during production inspections by automated inspection machines such as automated optical inspection (AOI), automated X-ray inspection (AXI), solder paste inspection (SPI), in-circuit testing (ICT), and the like; additionally or alternatively, defects can be detected by manual inspection processes and/or any other suitable inspection tools and/or processes. These inspection machines typically make measurements on a product (e.g., panelized array of 1 or more circuit boards, typically processed as a single unit) and use those measurements to detect production defects. In examples, such production defects can include missing components, incorrect components (e.g., wherein a component of the wrong type is placed at a location intended for a different component), misoriented components (e.g., rotated, "tombstone", incorrect polarity such as flipped, etc.), displaced components (e.g., laterally displaced from the appropriate location by more than a threshold amount, too close to another component or trace, etc.), electrical defects (e.g., open circuit, short circuit, resistance out of tolerance such as high or low resistance, capacitance out of tolerance such as high or low capacitance, analog measurement of a voltage value on a circuit node not correct, etc.), solder defect (e.g., solder bridging, solder joint not formed correctly, solder paste volume too high or too low, solder paste deposit not in the correct location, solder paste dimensions not correct, such as wherein the solder paste width, length, and/or height are not within bounds, etc.), OCR failure, and the like.

In typical factory operation, these production defects are associated with (e.g., labeled with, identified based on, etc.) a defect type and/or one or more location fields, such as the array position, reference designator, and/or pin number. For example, each defect can be labeled with a defect type, array position, reference designator, and optionally a pin number. The array position preferably specifies a circuit board (e.g., top-right, bottom-left, position #2, etc.) within the array of circuit boards. The reference designator preferably specifies the defective component (within the particular circuit board specified by the array position), such as C16, U1, R5, etc. The pin number can specify a particular component pin (of the component specified by the reference designator), such as pin 1, 2, 3, 4, etc., but can alternately be omitted in some or all cases (e.g., for defects not associated with a particular pin). The defect type preferably specifies the type of production defect that has been identified, more preferably using one of a standardized set of defect type labels (e.g., "MISSING", "OPEN", "TOMBSTONE", etc.). However, the defects can additionally or alternatively be associated with any other suitable information.

However, the manufacturing systems can additionally or alternatively include systems for any other suitable manufacturing and/or other production tasks, and/or can include any other suitable manufacturing and/or inspection tools.

4. Method

4.1 Receiving Factory Information

Receiving factory information S110 preferably functions to receive information about defects detected in factory products (e.g., defects such as described above regarding the manufacturing system), such as defects detected by automated inspection machines. The factory information is preferably received by (and/or stored at) one or more computing systems and/or analysis tools, but can additionally or alternatively be received by any other suitable entities.

The defect information received in S110 preferably includes, for each defect (or a subset thereof), a defect type and one or more location fields (e.g., such as described above). Further, the defect information can optionally include timestamps (e.g., production timestamp, inspection timestamp, defect detection timestamp, etc.) and/or other time-related information (e.g., time window associated with the defect, such as a time window during which the defective product was produced and/or the defect was identified), product information (e.g., product identifier, product serial number, product type, CAD information, programming information, program name(s), etc.), and the like. However, the defect information can additionally or alternatively include any other suitable information.

Further, S110 can optionally function to receive other information about factory production (e.g., regarding passed inspections, defect-free production count, total production count regardless of defect state, etc.), about factory state (e.g., production and/or inspection tool state), about machine programming (e.g., program identifiers run on various machines in the factory, preferably received in association with timing information indicative of time periods during which the different programs were running on the machines, etc.), and/or any other suitable information. The information can be available and/or received on a per-component basis, a per-product type basis, a per-manufacturing line basis, a per-manufacturing tool basis, a time window basis, and/or any other suitable basis.

The factory information is preferably received in response (e.g., immediately or substantially immediately in response) to determination of the information, such as in real-time (or in near-real-time). In particular, the defect information is preferably received in response to defect identification, more preferably received immediately (or substantially immediately) in response to defect identification. However, the factory information can additionally or alternatively be received after a delay, received in batches, received periodically, received sporadically, and/or received with any other suitable timing.

The factory information is preferably received from the manufacturing system (e.g., from the inspection machines and/or assembly machines, from one or more manufacturing system controllers such as a centralized controller, etc.), but can additionally or alternatively be received from any other suitable entities.

However, S110 can additionally or alternatively include receiving any other suitable factory information in any suitable manner. Further, although referred to herein as receiving factory information, a person of skill in the art will recognize that S110 can additionally or alternatively include receiving information from and/or associated with any other suitable manufacturing system(s).

4.2 Associating Defects with Factory Components

Associating defects with factory components S120 preferably functions to enable identification of factory components (e.g., factory tools, such as assembly tools, and/or elements thereof; programming parameters; etc.) that may be responsible for the defects. S120 preferably includes determining potential links S125 (e.g., links between defects and factory components), and can optionally include determining data mappings S123 and/or determining defect rates S127. However, S120 can additionally or alternatively include any other suitable elements performed in any suitable manner.

4.2.1 Determining Potential Links

Figure 3A:
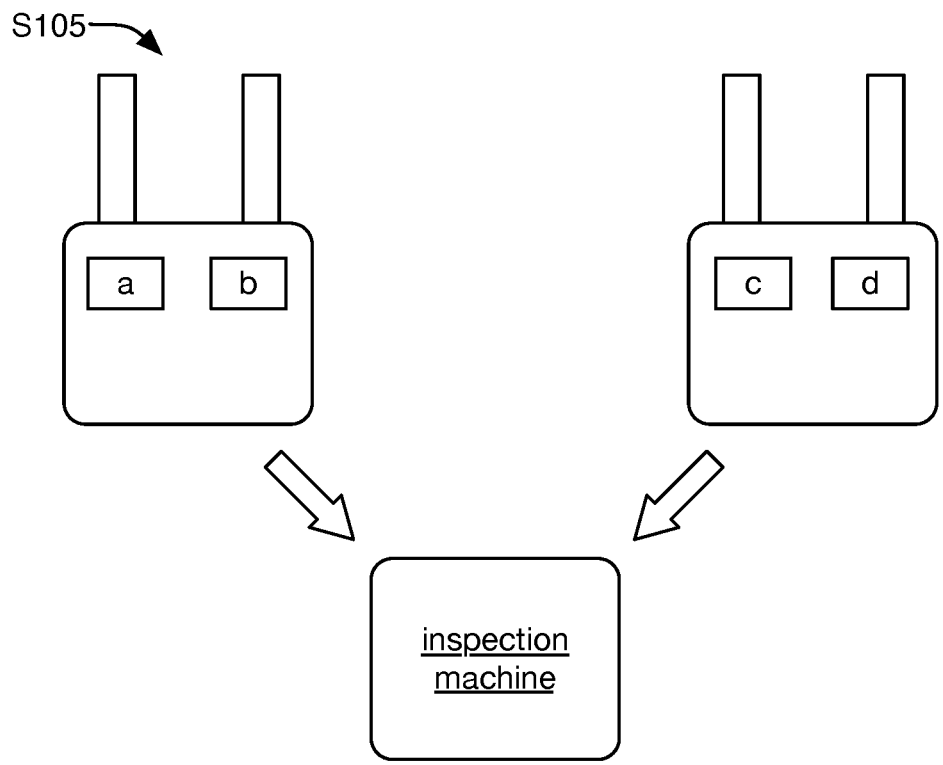
FIGS. 3A-3B are schematic representations of examples of elements of operating factory machines.
Figure 3B:
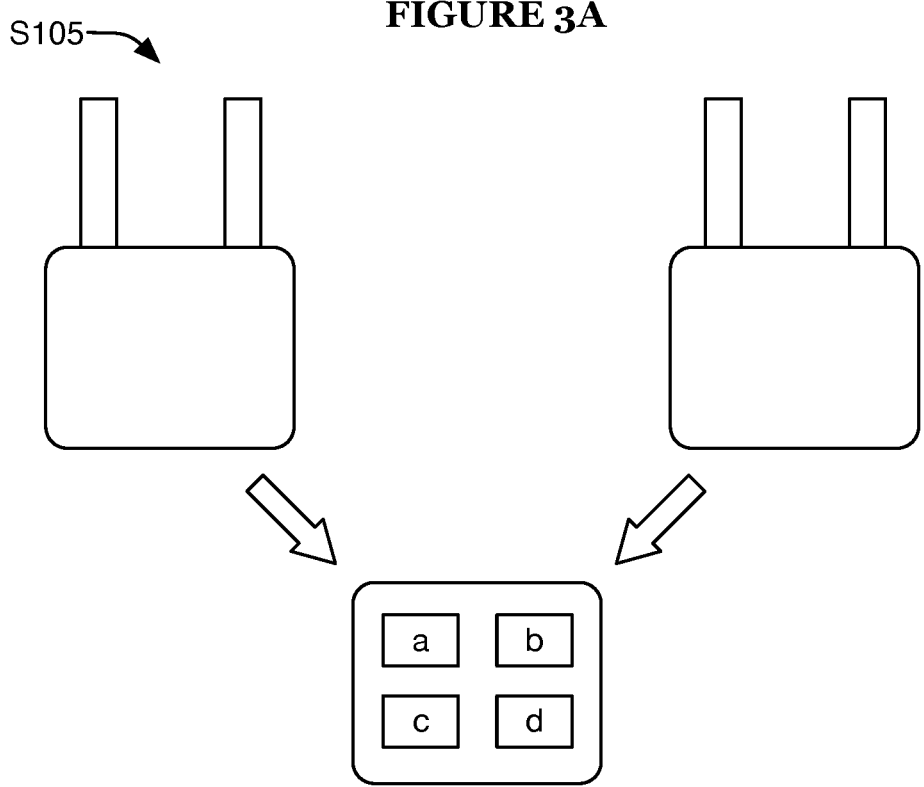
Figure 3C:
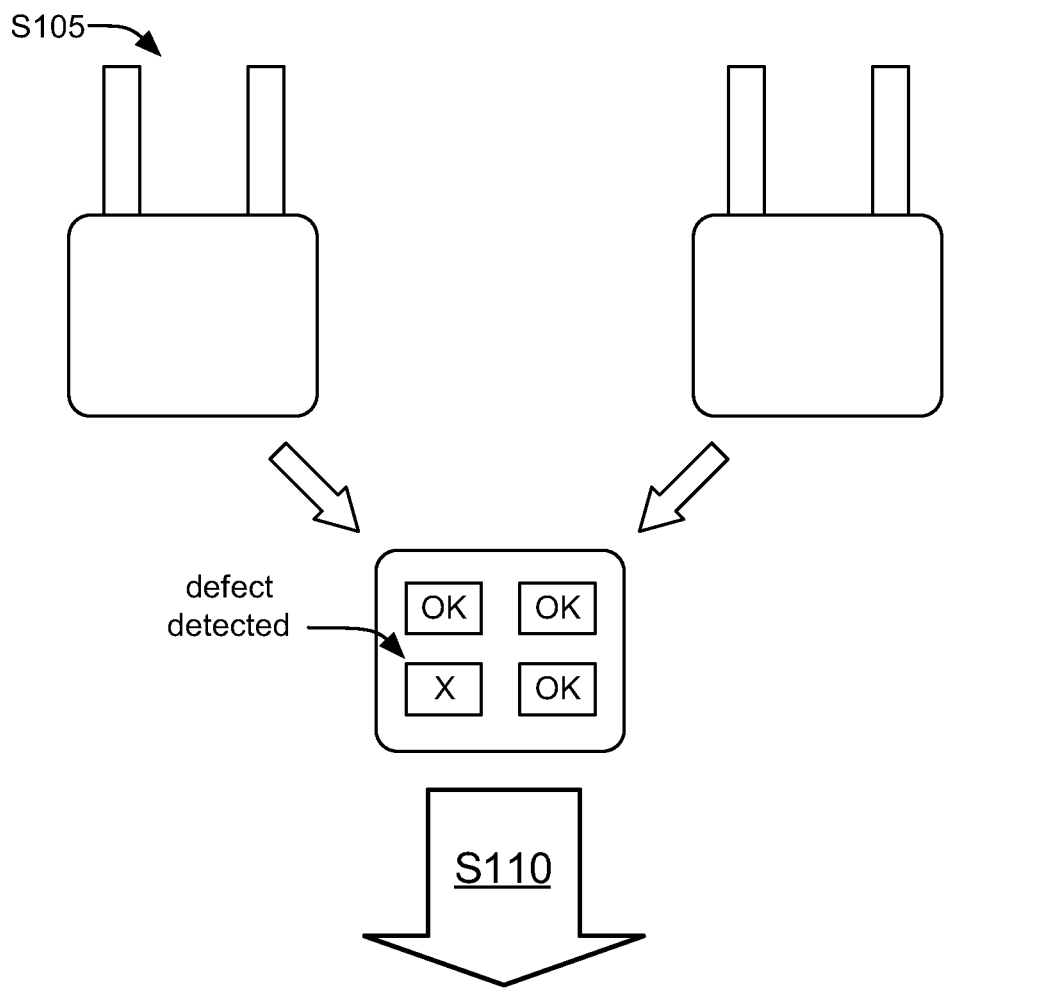
FIGS. 3C-3D are schematic representations of a first and second example, respectively, of associating defects with factory components.
Figure 3C:
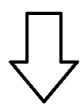
Figure 3C:
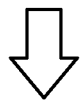
Figure 3D:
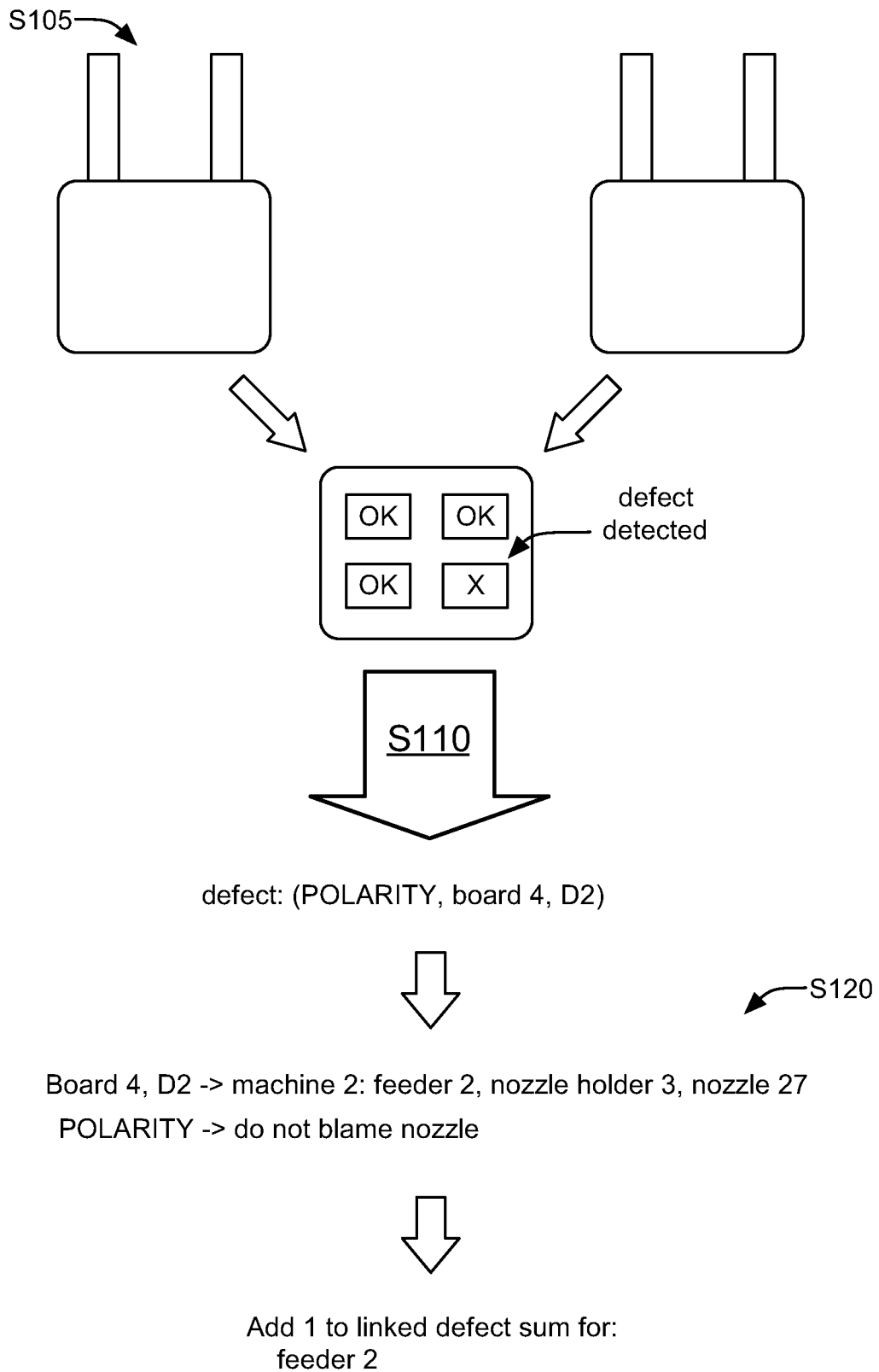

Determining potential links S125 preferably functions to determine potential links between defects and their causes (e.g., as shown in FIGS. 3C-3D). For example, S125 can function to determine (e.g., generate, preferably automatically) links between defect occurrences, defect characteristics (e.g., elements of the information received in association with the defects, the associated placement paths and/or aspects thereof, etc.), and/or factory components, such as the specific machine components that were involved in operations affecting specific components (e.g., R3 on circuit 1, pin 2 of U1 on circuit 4, etc.), preferably components associated with defects.

In some embodiments, this can include attributing blame or potential blame for defects to upstream factory components (e.g., any machine components and/or programming parameters, or a subset thereof, that affected elements associated with the defect before it was detected; any machine components and/or programming parameters that could have caused the defect; etc.). Thus, each defect can be linked not only to the associated product component (e.g., the component identified in the defect information received in S110), but also to the specific factory components (e.g., nozzles, feeders, component, programming shapes, etc.), that interact with the associated component.

For example, for each defect (e.g., each defect represented by the defect information received in S110), S125 can include noting the link between the defect (e.g., and/or the associated product component, such as U3 of circuit 2, indicated by the defect information) and the N machine components that interacted with the defect-associated product component before that defect was determined (or alternatively, noting the link between the defect and only a subset of such machine components). Noting these links can function to attribute potential blame for the defect to these machine components.

For each of the machine components, noting the link can be performed by adding the value of the link to a sum of defect links associated with that machine component. In a first example, this can include assigning blame for a defect to each of the associated machine components (e.g., adding 1 to each of the associated defect link sums), whereas, in a second example, this can include assigning fractional blame for the defect to each of the associated machine components (e.g., adding 1/N to each of the associated defect link sums, such as shown by way of example in FIG. 3C).

In some variations, in which only n of the N machine components are capable of contributing (or alternatively, are likely to contribute) to a defect of the type flagged, assigning blame for 1/n of a defect to each such machine component, and no blame to the remaining (N−n) machine components. For example, an incorrect polarity defect type is not typically attributable to a nozzle or nozzle holder (e.g., as the nozzle will not mistakenly flip the product component around), and so no blame for incorrect polarity defects should be assigned to any nozzle or nozzle holder (e.g., rather, blame for such defects is potentially attributable only to programming parameters and machine components involved in product component loading), such as shown by way of example in FIG. 3D.

In some variations, blame can be assigned non-uniformly, such as assigning greater blame to machine components more likely to have caused the defect (e.g., in a manner such that the sum of the amounts added to all the defect link sums is 1); for example, a first and second machine component may each be assigned ¼ of the blame for a defect, and a third machine component may be assigned the remaining ½ of the blame. A person of skill in the art will recognize that, analogously, the values described above could be multiplied by a factor c (e.g., adding c to each associated defect link sum, adding c/N to each associated defect link sum, adding to the associated defect link sums such that the sum of the amounts added is c, etc.), where c is any suitable value greater or less than unity.

In some variations, different defects can be associated with different amounts of blame (e.g., wherein more important or critical defects can be associated with greater amounts of blame). For example, a first defect can be associated with A units of blame (e.g., 1 unit), and a second defect can be associated with B units of blame (e.g., 2 units). Accordingly, in a first specific example, in which the blame is apportioned equally between potentially-responsible factory components, the N components associated with the first defect will each be assigned A/N units of blame (e.g., 1/N units), and the M components associated with the second defect will each be assigned B/M units of blame (e.g., 2/M units). Alternatively, in a second specific example, in which each potentially-responsible factory component is assigned full blame for a defect, the N components associated with the first defect will each be assigned A units of blame (e.g., 1 unit), and the M components associated with the second defect will each be assigned B units of blame (e.g., 2 units). However, the different defects can additionally or alternatively be associated with different (and/or the same) amounts of blame in any other suitable manner, and/or the blame can additionally or alternatively be assigned to factory components in any other suitable manner (e.g., apportioning fractional blame non-uniformly between the different factory components).

Additionally or alternatively, S125 can include generating (and/or adding to) a web of links between product features (e.g., features on one or more circuit boards, such as individual SMT components or pins thereof) and the upstream factory components (e.g., factory operations, programming attributes, machines, and/or machine components, etc.). This web of links can be used to generate a matrix (e.g., stochastic matrix) describing the strength of links between the product features and the factory components. In this matrix, the values can be representative of a sensitivity analysis of which parameters and/or systems are the most common causes of defects over time (e.g., and therefore may merit maintenance and/or alteration, such as described below in more detail regarding S130).

In examples, S125 can include, for all machines upstream of an inspection machine (or a subset thereof), creating a list of the machine systems and parameters that were involved in placing a given reference designator on a given board at a given array position on the panel; and then (e.g., when a defect is flagged) using the associated information to distribute blame for the defect (e.g., as described above) to all of the involved systems (or to any suitable subset thereof).

However, in some embodiments, the defect information received in Silo may not be sufficient to uniquely identify the particular product component associated with the defect (and/or to determine the set of factory component to which blame for the defect should be attributed). For example, there may not be sufficient information to enable mapping the array position reported with the defect to a particular board (e.g., to map between the array positions reported by the inspection machine and the assembly machines); accordingly, the reference designator reported with the defect could represent any one of a number of different product components (e.g., one on each board, or a subset thereof, such as each board having such a component).

For example, array numbering may be inconsistent across different machines, such as machines from different machine vendors. In one example, all machines will agree that there are 6 circuits in an array, such as arranged in a 2×3 rectangular array. However, an inspection machine may assign array positions in a snake fashion, in ascending order from 1 at the top right to 6 at the bottom left, whereas a placement system may assign array positions in a brick laying fashion, in ascending order from 1 at the bottom left to 6 at the top right.

It may be possible to resolve this ambiguity in some cases (e.g., as described below in more detail regarding S123). However, in other cases, the ambiguity may remain (e.g., S123 is not performed, attempts to resolve the ambiguity are not made, insufficient information is available to resolve the ambiguity, etc.). Accordingly, in some examples (e.g., in which ambiguity remains), the defect can be mapped to each of these potentially-defective product components, and then, for each of these potentially-defective product components, blame can be linked to factory components such as described above. In a first example, blame for an entire defect is distributed for each potentially-defective product component, whereas in a second example, blame for a fractional defect, such as 1/B of a defect, for B potentially-defective product components (e.g., B different boards, each including one such potentially-defective product component), can be distributed for each potentially-defective product component (e.g., such that the amount added to each associated defect link sum is reduced by a factor of 1/B, as compared with the approach described above in which there is no ambiguity regarding the identity of the defective product component).

S125 can additionally or alternatively include determining time series associated with these defect links. In a first example, a time series for a factory component can include a timestamp of linked detect detection (and optionally, fractional defect blame apportionment). In a second example, the time series for a factory component can include a series of defect link sums, each accumulated over a short time window (equal to the temporal resolution of the time series). However, the time series can additionally or alternatively be determined in any other suitable manner.

However, S125 can additionally or alternatively include determining any other suitable potential links in any suitable manner.

4.2.2 Determining Data Mappings

Determining data mappings S123 can function to determine mappings between elements of data received from (and/or about) the manufacturing system (e.g., as described above in more detail regarding Silo), such as mappings that can further enable and/or facilitate defect analysis (e.g., enabling and/or facilitating determination of potential links, such as described herein regarding S125, determination of defect rates, such as described herein regarding S127, and/or analysis of such information, such as described herein regarding S130, etc.). In some examples, S123 can include transforming data (e.g., based on these mappings), such as transforming the data into forms that can further enable and/or facilitate this defect analysis.

Figure 4A:
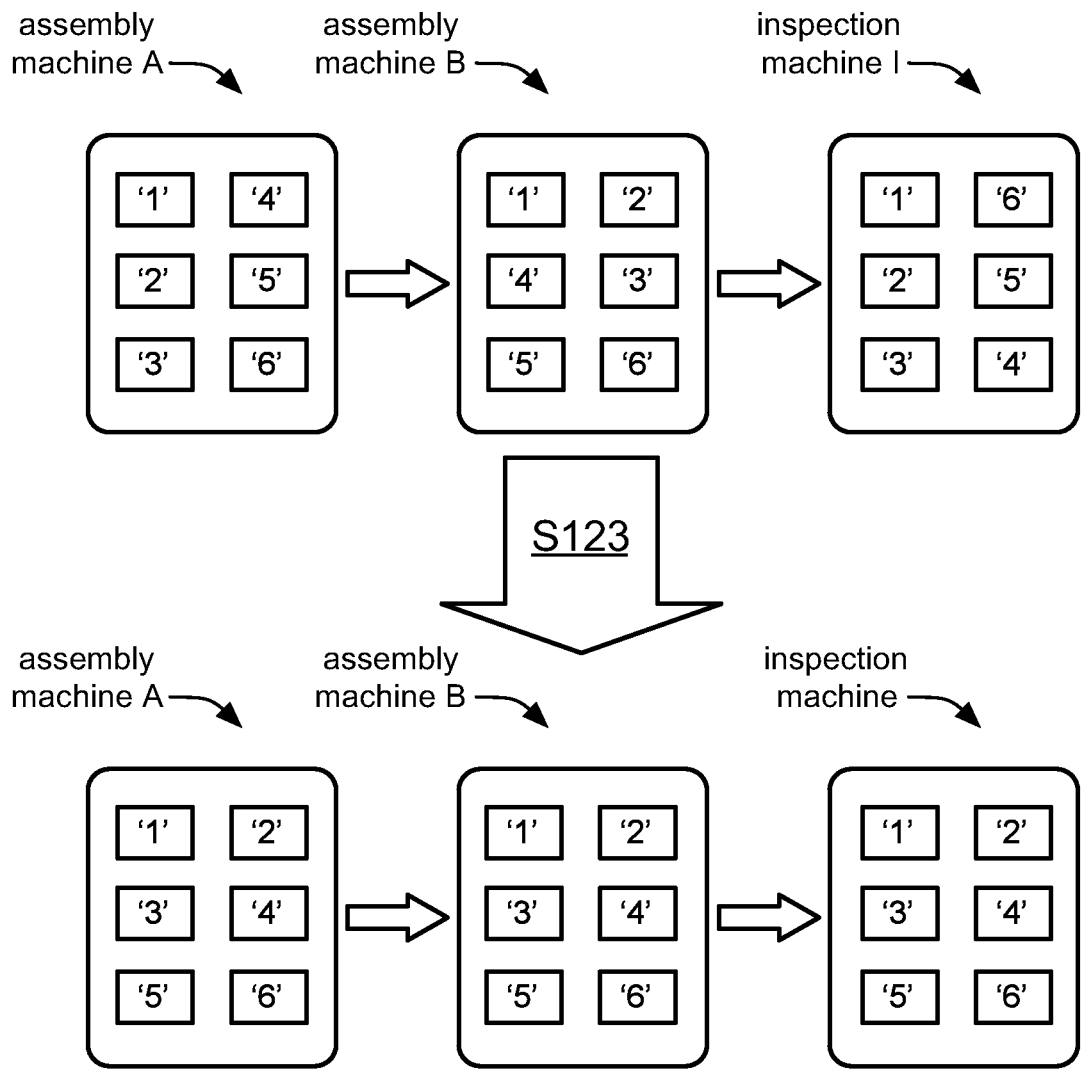
FIG. 4A is a schematic representation of an example of renumbering array position indicia.
Figure 4B:
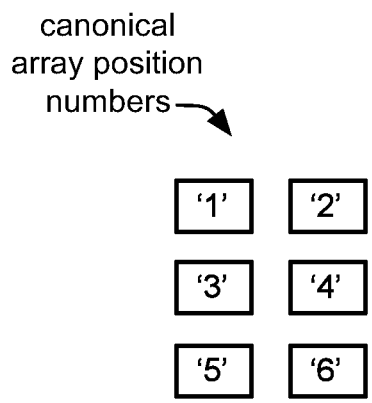
FIG. 4B is a schematic representation of an example mapping between the different array position indicia depicted in FIG. 4A.

In some embodiments, S123 can include determining mappings between array position indicia (e.g., array position numbers) associated with different manufacturing system machines (e.g., different assembly and/or inspection machines), such as shown by way of example in FIGS. 4A-4B. Such mappings can be determined based on CAD data (e.g., associated with the product to be produced by the manufacturing system), based on machine-specific reference information regarding the array position numbering, and/or based on any other suitable information. In some examples, such information can be determined in an automated manner (e.g., in real time or substantially in real time), such as by requesting the information from the factory machines. Further, S123 can optionally include transforming data (e.g., received in Silo) based on these mappings, such as by standardizing all array positions in the data, such that each array position indicator (e.g., number) is consistently representative of a particular array position (e.g., the array position '1' always represents the top-left board, the array position '2' always represents the top-right board, the array position '6' always represents the bottom-right board, etc.). In these embodiments, such mapping and/or renumbering can function to resolve ambiguities, such as those described above regarding S125, thereby facilitating more accurate determination of potential links between defects and factory components.

Additionally or alternatively, S123 can include (e.g., for each product for which information is received, or a subset thereof) determining links between program identifiers (e.g., program names) associated with different factory machines (e.g., different assembly and/or inspection machines) corresponding to production of a product (e.g., wherein the linked program identifiers each correspond to one or more aspects of production of the same product). For example, this can include determining that a set of program identifiers (e.g., program "X12_a" associated with a first machine, program "X12" associated with a second machine, program "X12_insp1" associated with a third machine, and program "a5" associated with a fourth machine) are all associated with portions of the production of the same product. These links can facilitate further understanding of production processes, can enable determination of product counts (e.g., as described below in more detail regarding S127), and/or can be used in any other suitable manner.

Figure 5:
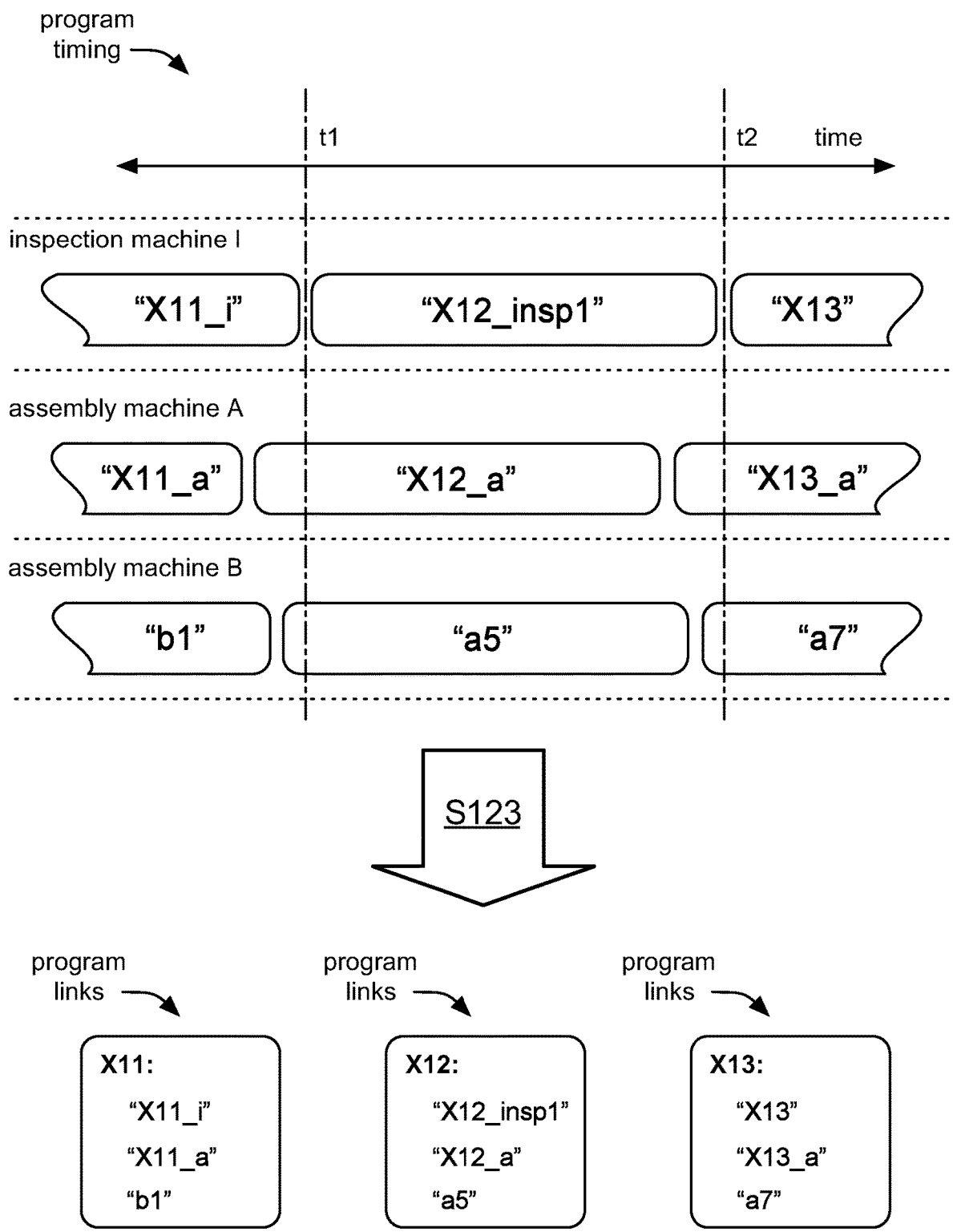
FIG. 5 is a schematic representation of an example of determining program links based on temporal considerations.

In a first example, such program links can be determined based on temporal overlap (and/or proximity) of programs run on the different machines (e.g., within a single manufacturing line). For example, given an inspection program identifier and the associated time window(s) during which it was run on an inspection machine of a particular manufacturing line, the program links can be determined for the inspection program identifier based on the associated time window(s), such as shown by way of example in FIG. 5. For every other machine of the manufacturing line (or a subset thereof, such as each machine upstream of the inspection machine), the program identifier commonly running during (and/or proximal to) the associated time windows can be linked to the inspection program identifier, as it likely corresponds to the same product; if, for any machine, no single program identifier is sufficiently dominant during the associated time windows (e.g., is not running during at least a threshold fraction of the duration of the windows), a link may not be determined. Additionally or alternatively, temporal correlations between program identifiers can be determined, wherein any sets of program identifiers with a sufficiently strong (positive) correlation (or a subset of such sets) can be linked.

Figure 6A:
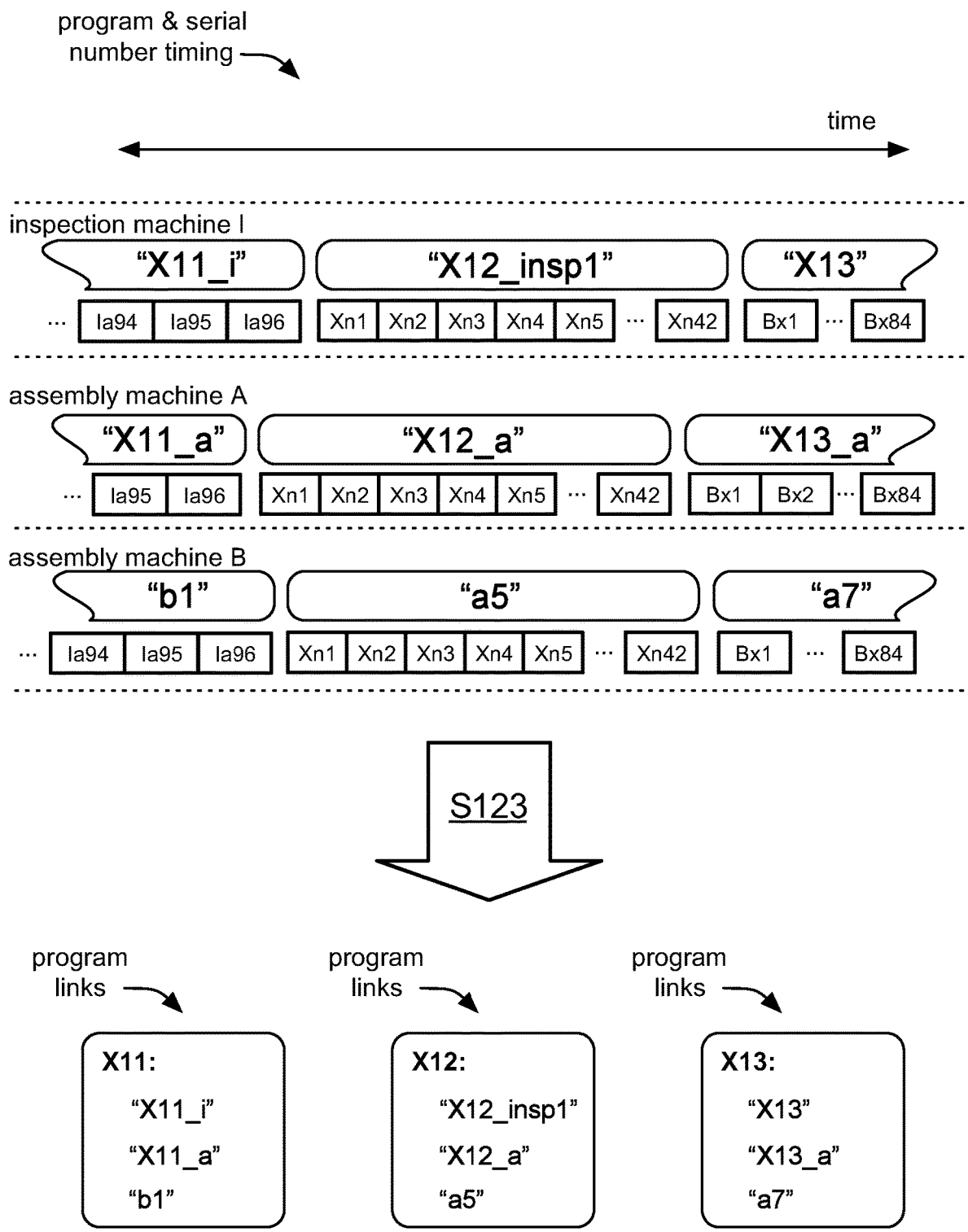
FIGS. 6A-6B are schematic representations of a first and second specific example, respectively, of determining program links based on product identifiers.
Figure 6B:
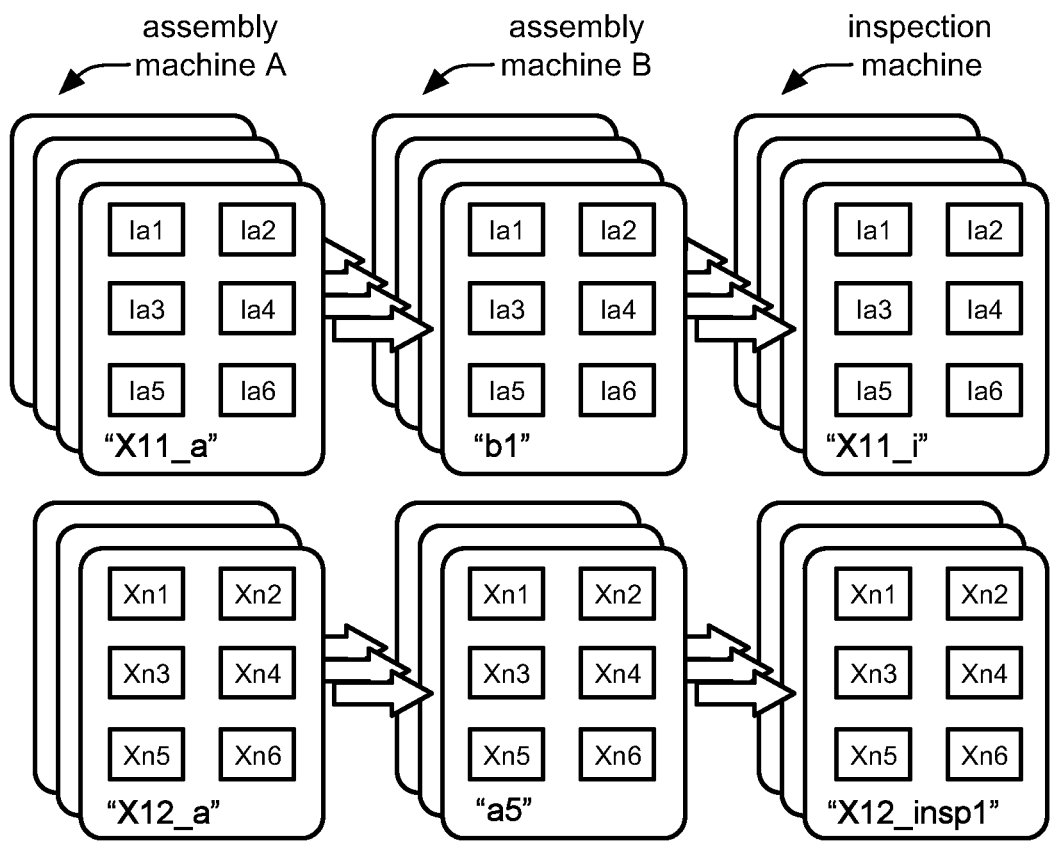
Figure 6B:
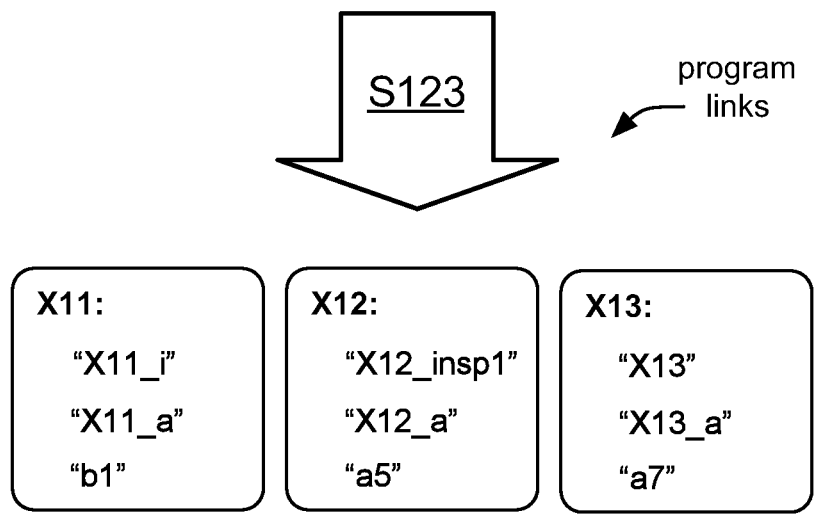

In a second example (which can be performed in addition to or instead of the first example), such program links can be determined based on product serial numbers (e.g., as shown in FIGS. 6A-6B). For example, given a set of one or more serial numbers (and/or other identifiers) associated with a particular product (e.g., a single board, a set of boards having identical designs, etc.), the times at which the product is present at a machine (e.g., as indicated by the serial number information) can be correlated with the program(s) run at that machine while the product is present, and the associated program identifiers can be linked to the product. This can be repeated for each machine (or a subset thereof) at which the product is known to have been present. Thus, the program identifiers linked to the product can then be linked to all other program identifiers (e.g., associated with other machines) that are also linked to the product.

However, S123 can additionally or alternatively include determining any other suitable data mappings (and/or transformations) in any suitable manner.

4.2.3 Determining Defect Rates

Determining defect rates S127 can function to provide additional context to the defect information (e.g., received in Silo) and/or the potential defect links (e.g., potential links and/or defect link sums determined in S125). In some situations, defect rates can provide important context that is not discernable from defect counts alone. For example, in different situations, 100 defects could be associated with a high defect rate (e.g., 10%, corresponding to 100 defects out of 1000 total units produced), a low defect rate (e.g., 0.001%, corresponding to 100 defects out of 10 million total units produced), an intermediate defect rate (e.g., 0.1%, corresponding to 100 defects out of 100,000 total units produced), and/or any other suitable defect rate. Accordingly, it may be beneficial to determine the defect rates associated with various defects.

In many embodiments, the factory information received in Silo will include reports of detected defects, but will not include information indicative of successful production (e.g., counts of defect-free units produced, such as units of a particular product type or all units produced, etc.) or total production (e.g., total units produced, production "opportunities" including both units produced and defective units for which production was aborted, etc.). Accordingly, it can be difficult to determine defect rates (e.g., the ratio of the number of defects detected or defective units produced to the number of defect-free units produced, total units produced, or production opportunities) based on the received information. To overcome this difficulty, S127 can include determining one or more metrics associated with the total production (e.g., determining the number of production opportunities ("opportunity count") for a particular product type or a particular potential defect).

For example, the opportunity count for a potential defect is determined based on the inspection program that can detect that defect. In response to receiving information indicative of a particular defect (e.g., in response to the first time that information indicative of a defect with a particular reference designator is received in association with a particular product type), the defect can be checked against and/or added to (e.g., if not already present) a defects catalog that maps that defect (e.g., and all defects of the same reference designator associated with the same product type) to the associated inspection program responsible for detecting it; in a variation, the defects catalog may further specify defects based on the defect type (e.g., wherein defects at a particular reference designator of a particular product type may be mapped to different inspection programs, depending on the defect type). This defects catalog can include multiple defect entries mapped to each inspection program (but can additionally or alternatively include inspection programs associated with only one defect entry). Thus, the opportunity count for a defect can be determined based on (e.g., is equal to) the number of times the associated inspection program is run (e.g., during a specified time window, counted only after the defect is first added to the catalog or counted to also include runs performed before the defect is added, etc.).

Additionally or alternatively, the opportunity count for a potential defect can be determined based on links determined (e.g., in S123) between different programs (e.g., assembly & inspection programs) associated with the product type for that potential defect. Thus, even if information indicative of a number of inspection program runs is not available, the opportunity count can analogously be determined based on (e.g., as equal to) the number of times that an assembly program linked to that inspection program is run. In a specific example, in which a link between assembly program "prod17" and inspection program "prod17_insp" is known (e.g., has been determined in S123), both associated with manufacturing of product type 17, the opportunity count for all potential defects in product type 17 can be determined as equal to the number of runs of assembly program "prod17".

Additionally or alternatively, S127 can include receiving the opportunity count directly (e.g., receiving information representative of the opportunity count in Silo). However, S127 can additionally or alternatively include determining the opportunity count in any other suitable manner.

Once the opportunity count for a set of defects (e.g., all defects for a product type, all defects for a single reference designator within the product type, defects of a particular defect type at the single reference designator, and/or any other suitable set of defects) is known, S127 can include determining the associated defect rate by dividing the number of defects in the set by the opportunity count.

Additionally or alternatively, S127 can include determining defect rates associated with factory components. In some embodiments, these factory component defect rates can be determined in a manner analogous to that described above regarding S125 (e.g., regarding defect link sums and/or defect link time series). For example, rather than only determining links between defects and the upstream factory components, the method can also include determining links between each production opportunity (and/or each defect-free product, or the like) and the upstream factory components (e.g., determining an associated production opportunities sum for each upstream factory component, in a manner analogous to that described above regarding the defect link sums of S125). In other embodiments, the factory component defect rates can be determined based on estimated opportunity counts. For example, the opportunity counts can be estimated based on the production line configuration, and/or based on observed workload share of the different components (e.g., during a portion of the entire time for which opportunity count is to be determined). The estimate is preferably determined in conjunction with a known or estimated total opportunity count (e.g., for a particular product type, for a particular manufacturing line, etc.); for example, an estimated fraction of total opportunities performed by a particular factory component can be multiplied by a (known or estimated) total opportunity count to determine the estimated opportunity count for that factory component. In some examples of these embodiments, the defect rate for a factory component can be determined by dividing its defect link sum (e.g., determined in S125) by the (e.g., known or estimated) total number of production opportunities; however, the factory component defect rates can additionally or alternatively be determined in any other suitable manner. In some examples of these embodiments, the method can additionally or alternatively include acting (e.g., presenting information, performing inspections and/or maintenance, etc.) based on one or more of the factory component defect rates (e.g., in a manner analogous to actions taken based on defect link sums, such as described in more detail regarding S130), and/or performing any other suitable actions based on the factory component defect rates.

However, S127 can additionally or alternatively include determining defect rates in any other suitable manner, and/or can additionally or alternatively include any other suitable elements performed in any suitable manner.

4.3 Acting Based on Defect Associations

The method can optionally include acting based on defect associations S130, which can function to diagnose manufacturing system faults (e.g., resulting in high defect rates and/or low production rates) and/or to improve, enable improvement of, and/or facilitate improvement of manufacturing system function (e.g., by decreasing defect rates and/or increasing production rates). The actions taken in S130 are preferably informed by the defect associations determined in S120 (e.g., defect link sums, defect rates, etc.), and can additionally or alternatively be informed by any other suitable information determined and/or received during performance of the method. In some embodiments, S130 can include determining one or more elements of manufacturing system maintenance information (e.g., information determined based on the defect associations, such as information associated with and/or indicative of manufacturing system faults and/or possible resolutions) and acting based on the one or more elements of manufacturing system maintenance information (e.g., providing the information to users, performing inspections and/or maintenance based on the information, etc.). In examples, the manufacturing system maintenance information can include information associated with and/or indicative of: factory components that may be responsible for manufacturing system faults, maintenance actions, recommendations, and/or prioritizations, and/or any other suitable information (e.g., other information described herein, such as with respect to S130).

In some embodiments, S130 can include presenting information (e.g., derivative information, such as information determined based on the information received in Silo and/or determinations made in S120) to one or more users. For example, S130 can include presenting potentially-problematic factory components to the users (e.g., providing information indicative of the potential problem(s) to the users).

For example, S130 can include generating and/or presenting a list of factory components that may be responsible for unacceptable (e.g., increased) defect rates on a manufacturing line (and/or may be otherwise problematic). This list may be used in order to inform decisions about maintenance to be performed (e.g., preventative maintenance performed during a scheduled manufacturing line stop, reactive maintenance performed to eliminate root causes of high defect rates during a manufacturing line quality stop, etc.). For example, this list can include the factory components (e.g., feeders, nozzles, nozzle holders, cameras, programming parameters, etc.) with the highest overall blame for defects (e.g., highest linked defect sum and/or linked defect rate), which may be particularly useful for preventative maintenance, and/or the factory components with the highest blame (e.g., linked defect sum and/or rate) for defects of a particular type or types and/or associated with a particular component or set of components (e.g., defect type(s) and/or component(s) for which the defect rate is particularly high). Additionally or alternatively, the list can include any factory components for which the defect blame (e.g., total count, defect rate, etc.) is greater than a threshold amount (e.g., uniform threshold, threshold determined on a per-component or per-component-type basis, etc.; fixed threshold and/or threshold determined dynamically, such as based on overall factory performance, etc.). Additionally or alternatively, factory components can be selected for the list based on an automated anomaly detection system (e.g., machine learning system, such as one that accepts defect rate time series for the factory components as inputs).

In a variation of this example, the list may be filtered and/or prioritized based on anticipated time, cost, and/or impacts of performing maintenance associated with the different factory components. For example, the list may be filtered and/or sorted based on anticipated return-on-investment of maintenance resources (e.g., maintenance costs, factory or factory line stoppage time, etc.). In some embodiments, S130 can include providing a suggested maintenance list for current or upcoming (e.g., planned, required or desired due to poor performance such as poor yield and/or production rate, etc.) factory or factory line stoppages. In one example, based on a planned stoppage duration (e.g., 5 minutes, 15 minutes, 2 hours, etc.), the list can be filtered to include only maintenance tasks anticipated to fit within the planned stoppage duration (e.g., wherein each task is anticipated to require less time than the planned stoppage duration; wherein the total anticipated time required for a set of tasks associated with a particular maintenance resource, such as a maintenance worker or team, is less than the planned stoppage duration; etc.) and/or sorted to prioritize the tasks with the highest anticipated value (e.g., with respect to anticipated increased product yield and/or production rate) and/or highest anticipated return-on-investment (e.g., with respect to a ratio of the anticipated value to the anticipated maintenance time).

Additionally or alternatively, S130 can include taking action in response to determining that a factory component may be problematic. For example, S130 can include alerting users, altering manufacturing line operation (e.g., to avoid or reduce use of the problematic factory component), and/or initiating maintenance (e.g., of the problematic component and/or other associated factory components). Determining that the component may be problematic can include determining that the defect blame has exceeded a threshold amount (e.g., as described above), determining that the component's operation is anomalous (e.g., based on an automated anomaly detection system, such as the machine learning system described above).

Additionally or alternatively, S130 can include presenting the derivative information to one or more users in a manner that enables the user(s) to explore various aspects of the information, such as via a user interface (UI) that enables viewing data slices associated with various defects, product components, factory components (e.g., tools, tool elements, programming parameters, etc.), and/or any other suitable aspects.

For example, the UI can display defect heatmaps for upstream machine components (e.g., nozzles, feeders, feeder attachment locations, etc.), component types, shape codes (associated with programming parameters shared by one or more component types), and the like.

Additionally or alternatively, the UI can enable users to filter the defect data. For example, looking at defects associated with component U1 (of a particular product type), the U1 can show that U1 is placed by 2 machines from 3 feeders, but that the vast majority of defects arise from only one of the machines (even though identical parts are loaded in both machines). Based on this information, the user may conclude that the problem is associated with the that one machine. Next, the user may look at additional defects associated with components of that one machine (e.g., removing the U1 filter, and filtering instead by machine component for that machine), thereby discovering a machine component associated with many defects (e.g., associated with different SMT components), which is likely the machine component at fault for most or all of these defects. Alternatively, the defects for the filtered component may not be predominantly attributed to any one machine (e.g., may be substantially uniformly dispersed between the machines). Rather, many defects may be present for the product component (e.g., SMT component, such as a particular resistor, capacitor, IC package, etc.) and/or for its shape code, across multiple machines, which may be indicative of a programming error (e.g., poorly-selected parameters for component placement).

As a person of skill in the art will recognize, some or all such functionality can additionally or alternatively be automated, wherein this analysis (or a subset thereof) may be performed without human intervention.

Further, S130 can additionally or alternatively include (e.g., in response to determining one or more factory components associated with a high defect rate and/or associated with a particular defect), the method can optionally include performing maintenance (and/or altering programming parameters) to reduce or eliminate the defect rate. In a first example, in response to a problematic defect rate, the machine components and/or programming parameters associated with the defect can be corrected (e.g., via immediate or deferred maintenance of the associated components). In a second example, the method can include determining a priority list of machine components on which predictive maintenance should be performed (e.g., wherein the highest priority component is associated with the highest defect rate, or the highest ROI such as a ratio of defect rate to typical maintenance time), and the priority list can be used to perform predictive maintenance during line downtime (e.g., shift changes, product changes, etc.).

However, S130 can additionally or alternatively include taking any other suitable actions based on the defect associations (and/or based on any other suitable information determined and/or received in performance of the method).

4.4 Operating Factory Machines

The method can optionally include operating factory machines S105 (e.g., as shown in FIGS. 3A-3D), which can function to manufacture and/or inspect the products (e.g., SMT boards) designated to be produced by the factory machines. S105 can include operating the assembly machines (e.g., based on the programming associated with one or more products), operating the inspection machines (e.g., based on the programming associated with the one or more products), and/or providing information (e.g., manufacturing system state, defect detection, etc.) for analysis (e.g., provided to one or more analysis tools, such as computing systems). The information is preferably received such as described above regarding S110, but can additionally or alternatively include any other suitable information to be used in any suitable manner.

Although omitted for conciseness, the preferred embodiments include every combination and permutation of the various system components and the various method processes. Furthermore, various processes of the preferred method can be embodied and/or implemented at least in part as a machine configured to receive a computer-readable medium storing computer-readable instructions. The instructions are preferably executed by computer-executable components preferably integrated with the system. The computer-readable medium can be stored on any suitable computer readable media such as RAMs, ROMs, flash memory, EEPROMs, optical devices (CD or DVD), hard drives, floppy drives, or any suitable device. The computer-executable component is preferably a general or application specific processing subsystem, but any suitable dedicated hardware device or hardware/firmware combination device can additionally or alternatively execute the instructions.

The FIGURES illustrate the architecture, functionality and operation of possible implementations of systems, methods and computer program products according to preferred embodiments, example configurations, and variations thereof. In this regard, each block in the flowchart or block diagrams may represent a module, segment, step, or portion of code, which comprises one or more executable instructions for implementing the specified logical function(s). It should also be noted that, in some alternative implementations, the functions noted in the block can occur out of the order noted in the FIGURES. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

As a person skilled in the art will recognize from the previous detailed description and from the figures and claims, modifications and changes can be made to the preferred embodiments of the invention without departing from the scope of this invention defined in the following claims.

We claim:

1. A method for manufacturing system maintenance, comprising:
  receiving information associated with manufacturing, at a manufacturing system, of a plurality of products, the information indicative of a set of defects detected in products of the plurality; wherein, for each defect of the set, the information comprises a respective set of location information indicative of a respective defective product component;
  for each defect of the set:
    based on the respective defective product component, automatically determining a respective set of components of the manufacturing system, wherein each component of the respective set has interacted with the defective product component; and
    for each component of the respective set, based on the link between the component and the defect, increasing a respective defect link sum associated with the component; and
  based on the defect link sums, controlling maintenance of the manufacturing system.

2. The method of claim 1, wherein controlling maintenance of the manufacturing system comprises:
  based on the defect link sums, identifying a set of components of the manufacturing system that have an elevated probability of defective operation; and
  in response to identifying the set of components, selecting the set of components for inspection.

3. The method of claim 2, wherein identifying the set of components comprises selecting components with the highest defect link sums of the components of the manufacturing system.

4. The method of claim 2, wherein identifying the set of components comprises:
selecting, from the set of defects, a problematic subset of defects; and
identifying the set of components based on association of the components of the set with the defects of the problematic subset.

5. The method of claim 1, wherein controlling maintenance of the manufacturing system comprises:
based on the defect link sums, identifying a component of the manufacturing system that has an elevated probability of defective operation; and
in response to identifying the components, selecting the component for repair.

6. The method of claim 1, wherein the products of the plurality are printed circuit board assemblies (PCBAs), wherein the product components are surface-mount technology (SMT) components, wherein, for each defect of the set, the respective set of location information comprises:
an array position indicative of a PCBA within the manufacturing system; and
a reference designator indicative of an SMT component of the PCBA.

7. A method for manufacturing system maintenance, comprising:
receiving information associated with manufacturing, at a manufacturing system, of a plurality of printed circuit board assemblies (PCBAs), each PCBA comprising a respective set of surface-mount technology (SMT) components, the information indicative of a set of defects detected in PCBAs of the plurality; wherein, for each defect of the set, the information comprises a respective set of location information indicative of a respective SMT component associated with the defect;
for each defect of the set:
based on the respective SMT component, automatically determining a respective set of components of the manufacturing system, wherein each component of the respective set has interacted with the SMT component; and
for each component of the respective set, based on the link between the component and the defect, increasing a respective defect link sum associated with the component;
based on the defect link sums, determining manufacturing system maintenance information; and
providing the manufacturing system maintenance information.

8. The method of claim 7, wherein, for each defect of the set, the respective set of location information comprises:
an array position indicative of a PCBA within the manufacturing system; and
a reference designator indicative of an SMT component of the PCBA, wherein the SMT component is associated with the defect.

9. The method of claim 8, wherein, for each defect of the set, the information further comprises a respective defect type label.

10. The method of claim 9, wherein, for a first defect of the set, the respective defect type label is indicative of a tombstone defect type.

11. The method of claim 8, wherein, for at least one defect of the set, the respective set of location information further comprises a pin number of the SMT component.

12. The method of claim 8, further comprising determining a defect rate associated with a first reference designator, comprising:

determining, based on the information, the number of defects associated with the first reference designator;
determining that a defect associated with the first reference designator was identified by a first inspection process;
receiving inspection information indicative of the number of times that the first inspection process was performed; and
determining the defect rate based on the number of defects and the number of times.

13. The method of claim 12, wherein the defect rate is equal to the ratio of the number of defects to the number of times.

14. The method of claim 7, wherein, for each defect of the set, a total defect link amount is apportioned between each component of the respective set, wherein each respective defect link sum is increased by a respective fractional amount of the total defect link amount.

15. The method of claim 14, wherein the respective fractional amounts are equal, wherein each respective fractional amount is equal to the total defect link amount divided by the number of components of the respective set.

16. The method of claim 14, wherein the total defect link amount is equal for each defect of the set.

17. The method of claim 7, wherein, for each defect of the set, automatically determining the respective set of components comprises determining each component of the manufacturing system that has interacted with the SMT component.

18. The method of claim 17, wherein, for a first defect of the set:
a first component of the manufacturing system has interacted with the SMT component;
the information further comprises a defect type label; and
automatically determining the respective set of components further comprises:
determining, based on the defect type label, that the first component is not responsible for the defect; and
in response to determining that the first component is not responsible for the defect, excluding the first component from the respective set of components.

19. The method of claim 18, wherein, for the first defect:
the defect type label is indicative of a polarity defect type; and
the first component is a nozzle.

20. The method of claim 7, further comprising, for each defect of the set:
based on the respective SMT component, automatically determining a respective set of programming parameters, wherein each programming parameter of the respective set has affected manufacturing system interaction with the SMT component; and
for each programming parameter of the respective set, based on the link between the programming parameter and the defect, increasing a respective defect link sum associated with the programming parameter;
wherein the manufacturing system maintenance information is determined based further on the defect link sums associated with the programming parameters.

21. The method of claim 20, further comprising, based on the defect link sums associated with the programming parameters:
selecting a programming parameter; and
altering a value of the programming parameter.

* * * * *